(12) United States Patent
Ho

(10) Patent No.: US 9,287,066 B2
(45) Date of Patent: Mar. 15, 2016

(54) KEY STRUCTURE FOR ELECTRONIC PRODUCT

(71) Applicant: HON HAI PRECISION INDUSTRY CO., LTD., New Taipei (TW)

(72) Inventor: Chin-Lung Ho, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 116 days.

(21) Appl. No.: 13/858,032

(22) Filed: Apr. 6, 2013

(65) Prior Publication Data

US 2013/0222316 A1 Aug. 29, 2013

Related U.S. Application Data

(63) Continuation-in-part of application No. 12/732,213, filed on Mar. 26, 2010.

(30) Foreign Application Priority Data

Jan. 23, 2010 (CN) .......................... 2010 1 0300624
Jan. 30, 2013 (TW) .............................. 102103593 A

(51) Int. Cl.
| | |
|---|---|
| H01H 13/50 | (2006.01) |
| G06F 3/044 | (2006.01) |
| G06F 3/0486 | (2013.01) |
| G06F 3/0354 | (2013.01) |
| H03K 17/96 | (2006.01) |
| G06F 3/0488 | (2013.01) |

(52) U.S. Cl.
CPC ........... *H01H 13/50* (2013.01); *G06F 3/03547* (2013.01); *G06F 3/044* (2013.01); *G06F 3/0486* (2013.01); *G06F 3/04883* (2013.01); *G06F 3/04886* (2013.01); *H03K 17/962* (2013.01); *G06F 2203/0337* (2013.01); *G06F 2203/0339* (2013.01); *H03K 2217/960755* (2013.01)

(58) Field of Classification Search
CPC ......... G06F 3/011; G06F 3/041; G06F 3/033; G06F 3/02; G06F 3/045; G06F 3/044; H01H 13/50
USPC ......................................................... 345/168
See application file for complete search history.

(56) References Cited

U.S. PATENT DOCUMENTS

2010/0321298 A1* 12/2010 Tsai et al. ..................... 345/168
2011/0248925 A1* 10/2011 Bowen .......................... 345/168

* cited by examiner

*Primary Examiner* — Andrew Sasinowski
(74) *Attorney, Agent, or Firm* — Novak Druce Connolly Bove + Quigg LLP

(57) ABSTRACT

A key structure in an electronic product includes a housing. The key structure includes a pressing portion, a printed circuit board (PCB), a key, and a sensor. The key and the sensor are both located on the PCB and electronically connected with each other. When the pressing portion is pressed, the key structure acts as a mechanical key. When the pressing portion is simply touched, the key structure acts as a touch key.

16 Claims, 24 Drawing Sheets

KEY STRUCTURE FOR ELECTRONIC PRODUCT

CROSS-REFERENCE TO RELATED APPLICATION

This is a continuation-in-part of, and claims the benefit of and priority from, U.S. patent application Ser. No. 12/732,213, filed Mar. 26, 2010, the full disclosure of which is incorporated herein by reference.

BACKGROUND

1. Technical Field

The present disclosure relates to portable and small electronic products, and more particularly to a key structure typically used in a portable or small electronic product.

2. Description of Related Art

Portable and other small electronic products such as mobile phones, tablet computers, electronic reader devices, video phones, internet phones, game consoles etc are very popular nowadays. Many people want a portable (or small) electronic product with a large screen. In order to enlarge the screen of a portable electronic product, a designer generally reduces an area of keys on a panel of the portable electronic product. However, in many portable electronic products, it is desired to have both mechanical key functionality and touch key functionality. When mechanical keys and touch keys are both applied to the portable electronic product, together they occupy a large area of the panel of the portable electronic product. Accordingly, the area of the screen is reduced, and the utility and marketability of the portable electronic product are limited.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Figure 1:
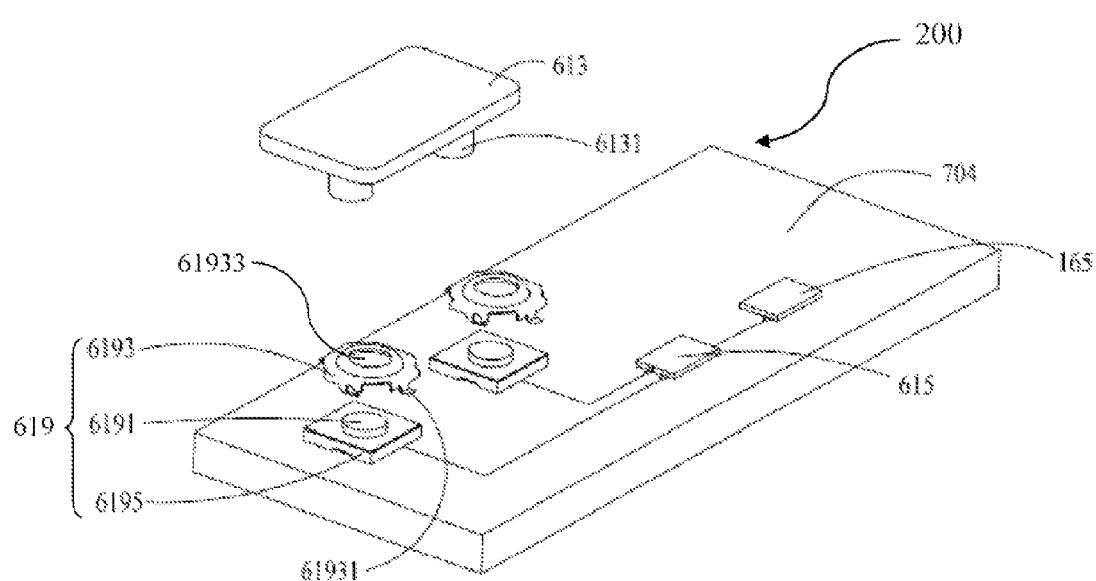
FIG. 1 is an exploded perspective view of a key structure of a first exemplary embodiment of the present disclosure.

The disclosure is illustrated by way of example and not by way of limitation in the figures of the accompanying drawings in which like reference numerals indicate the same or similar elements. It should be noted that references to "an" or "one" embodiment in this disclosure are not necessarily to the same embodiment, and such references can mean "at least one."

Figure 2:
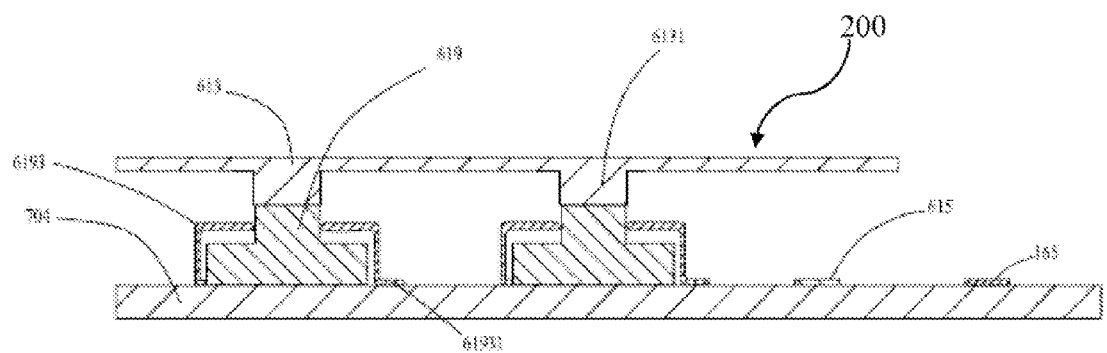
FIG. 2 is a cross-section of the key structure of FIG. 1 when the key structure is assembled.
Figure 7:
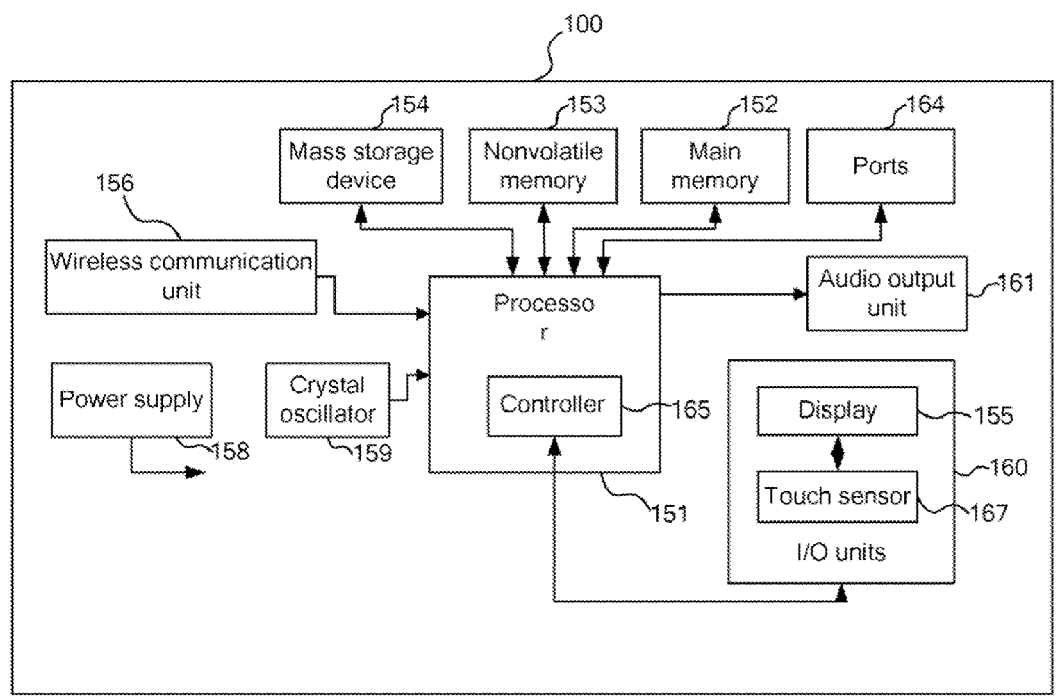
FIG. 7 is a block diagram of an exemplary embodiment of an electronic reader device.
Figure 16:
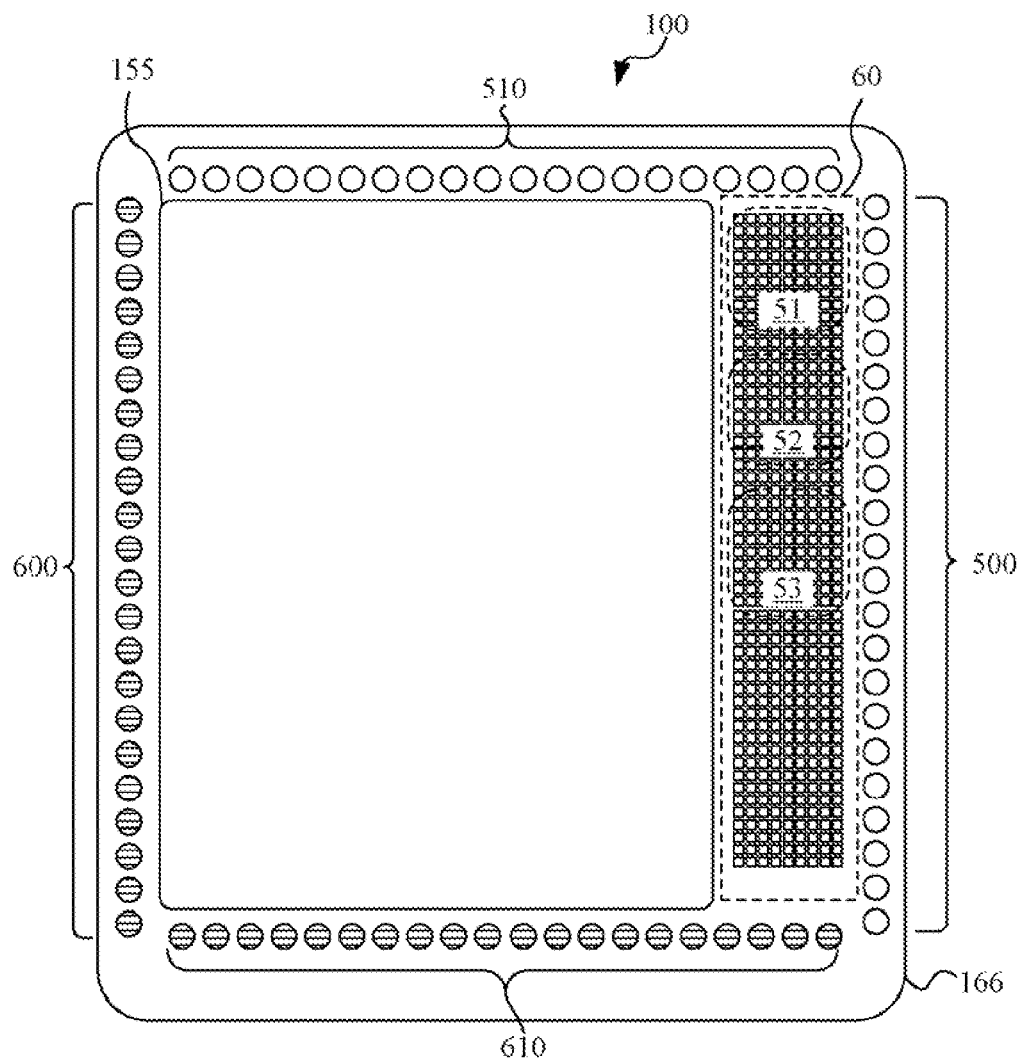
FIG. 16 is a schematic diagram of one embodiment of the electronic reader device, wherein a touch sensor of the electronic reader device comprises arrays of optical touch transmitters and receivers.

Referring to FIG. 1 and FIG. 2, a key structure 200 is configured in an electronic product. Referring also to FIGS. 7 and 16, the electronic product can for example be an electronic reader device 100, which includes a housing 166. The key structure 200 includes a pressing portion 613, a pair of keys 619, a sensor 615, and a printed circuit board (PCB) 704. The pressing portion 613 is located at an outside surface of the housing 166. The pressing portion 613 includes a pair of projections 6131 extending from a bottom side thereof into the housing 166. The projections 6131 extend towards respective trigger portions 6191 of the key 619.

The keys 619 are located between the pressing portion 613 and the PCB 704, and are electrically connected with the PCB 704. Each key 619 includes a body 6195, a trigger portion 6191 extending from the body 6195, and a conductive cover 6193. The conductive cover 6193 includes a pin 61931, which acts as a coupling end and is electrically connected to the sensor 615 through a conductive line. The conductive cover 6193 defines a first hole 61933. The trigger portion 6191 of the key 619 extends through the first hole 61933, and thus the conductive cover 6193 covers an outer surface of the body 6195. The projection 6131 makes contact with the trigger portion 6191 of the key 619.

In the present embodiment, the trigger portion 6191 of each key 619 is located under the pressing portion 613, and maintains contact with the pressing portion 613. In another embodiment, a gap may exist between the pressing portion 613 and the trigger portion 6191. A top surface of the pressing portion 613 can be considered to comprise two sections. One of the sections is located above, and corresponds to, one of the keys 619. The other section is located above, and corresponds to, the other key 619. Each section can be considered to comprise two areas; namely, a central first area corresponding to the trigger portion 6191 of the respective key 619; and a peripheral second area surrounding the first area and corresponding to the conductive cover 6193 of the respective key 619.

A controller 165 is electrically connected to the sensor 615. The sensor 615 is located on the PCB 704, and is electrically connected with the pin 61931 of the conductive cover 6193 of each of the keys 619.

In use, when a user's finger presses the first area of one of the sections of the pressing portion 613 (corresponding to the trigger portion 6191 of one of the keys 619), the key structure 200 acts as a mechanical key and has a function of a mechanical key. When the user's finger touches the second area of one of the sections of the pressing portion 613 (corresponding to the conductive cover 6193 of one of the keys 619), the sensor 615 receives a signal of change of capacitance transmitted by the conductive cover 6193 of the key 619, and transmits the signal to the controller 165. The controller 165 detects the touch on the pressing portion 613 and carries out the function of the touched key 619. As a result, the key structure 200 acts as a touch key and has a function of a touch key. That is, for each key 619, the key structure 200 has not only the function of a mechanical key, but also the function of a touch key. As a result, an area of keys 619 of a panel of the portable electronic product applying the key structure 200 is reduced, and more space is available for a screen of the portable electronic product. That is, the screen of the portable electronic product can be enlarged, which adds to the user's experience and enjoyment.

Figure 3:
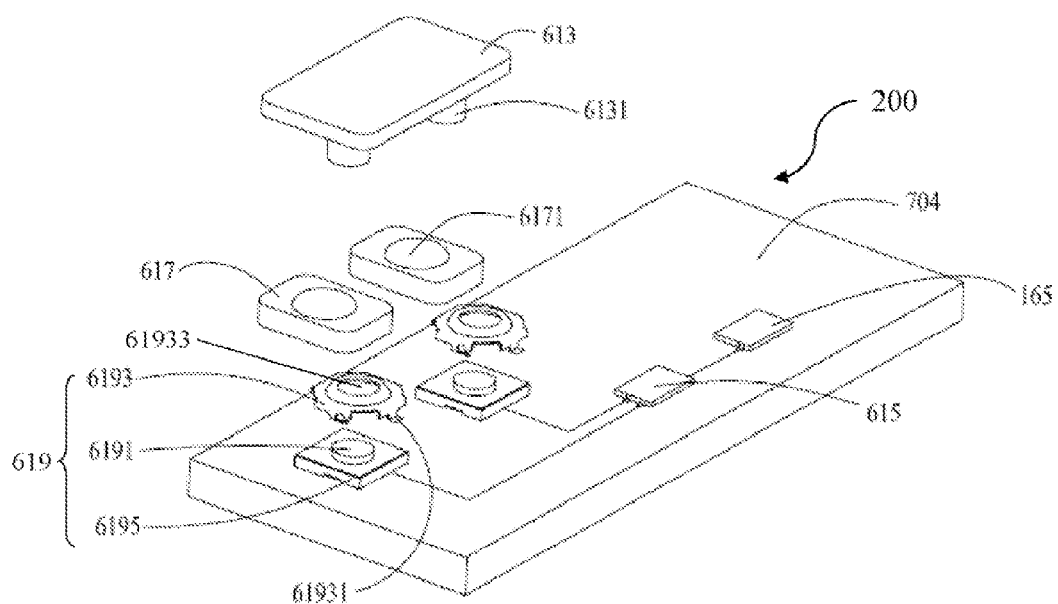
FIG. 3 is an exploded perspective view of a key structure of a second exemplary embodiment of the present disclosure, wherein the key structure includes a piece of conductive resilient material located between a key and a pressing portion.

FIG. 3 is an exploded perspective view of a second exemplary embodiment of the key structure 200 of the disclosure. In the embodiment, the key structure 200 includes a pair of conductors 617 located between the pressing portion 613 and the keys 619. A first side of each conductor 617 makes contact with the conductive cover 6193 of the corresponding key 619, and a second side opposite to the first side of the conductor 617 makes contact with the pressing portion 613. The conductor 617 defines a second hole 6171.

Figure 4:
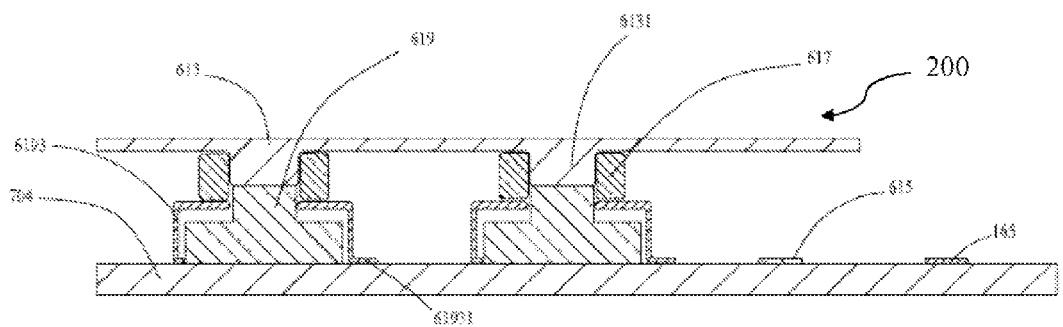
FIG. 4 is a cross-section of the key structure of FIG. 3 when the key structure is assembled.

Referring also to FIG. 4, in assembly, the trigger portion 6191 of each key 619 partly extends into one end of the second hole 6171 of the corresponding conductor 617, and the corresponding projection 6131 of the pressing portion 613 extends into the other end of the second hole 6171 of the conductor 617 and makes contact with the trigger portion 6191 of the key 619.

In use, when a user's finger presses the first area of one of the sections of the pressing portion 613 (corresponding to the trigger portion 6191 of one of the keys 619), the key structure 200 acts as a mechanical key and has a function of a mechanical key. When the user's finger touches the second area of one of the sections of the pressing portion 613 (corresponding to one of the conductors 617), the sensor 615 receives a signal of change of capacitance transmitted by the conductor 617 and the conductive cover 6193, and transmits the signal to the controller 165. As a result, the key structure 200 acts as a touch key and has the function of a touch key.

Figure 5:
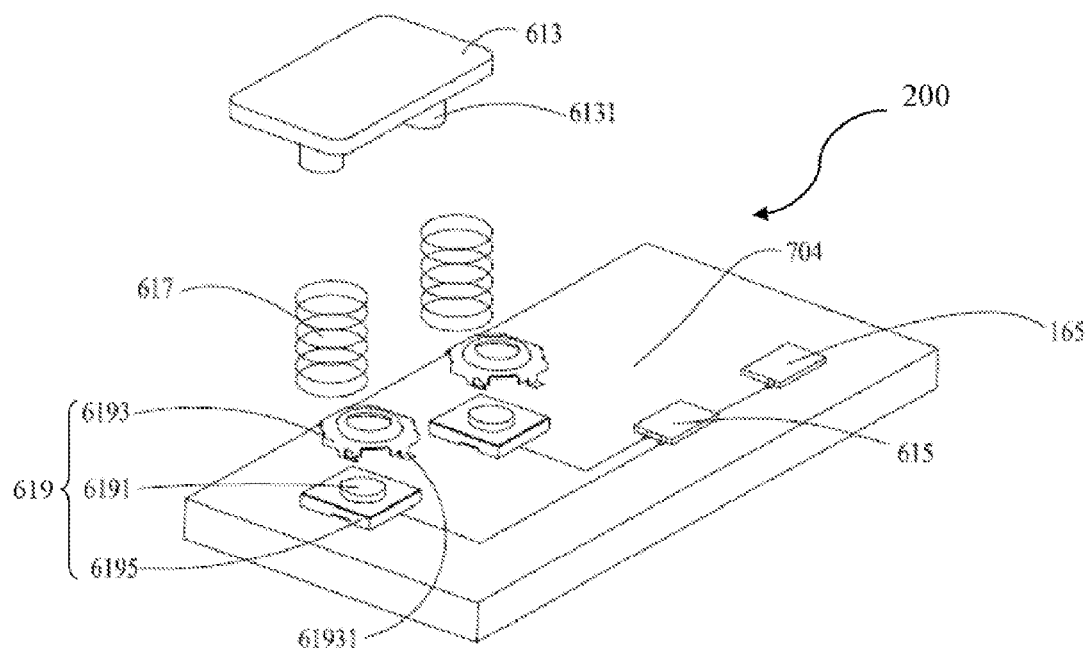
FIG. 5 is an exploded perspective view of a key structure of a third exemplary embodiment of the present disclosure, wherein the key structure includes a metal spring located between a key and a pressing portion.

Because each projection 6131 of the pressing portion 613 is in contact with the trigger portion 6191 of the corresponding key 619, when the pressing portion 613 is pressed, the projection 6131 triggers the trigger portion 6191 of the key 619 directly, which leads to sensitivity and accuracy in the use of the mechanical key. In the embodiment, the conductor 617 may comprises a conductive resilient material such as comprising a conductive sponge. The conductive resilient material can be easily assembled to the key structure 200, and is typically inexpensive. Alternatively, in a third exemplary embodiment of the key structure 200 of the disclosure, the conductor 617 may comprises a metal spring, as shown as FIG. 5.

Figure 6:
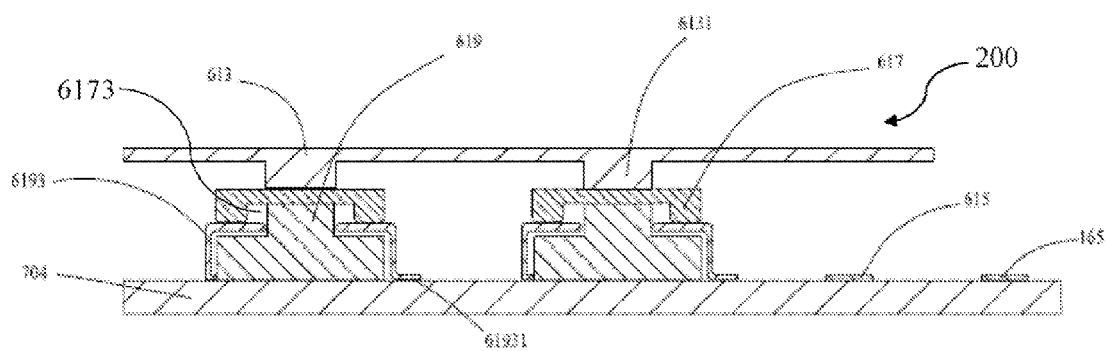
FIG. 6 is a cross-section of a key structure of a fourth exemplary embodiment of the present disclosure.

FIG. 6 is a cross-section of a fourth exemplary embodiment of the key structure 200 of the disclosure. In the embodiment, each of conductors 617 defines a bottom recess 6173, corresponding to the trigger portion 6191 of the corresponding key 619. The conductor 617 is located between the pressing portion 613 and the corresponding conductive cover 6193, with the trigger portion 6191 of the key 619 being received in the recess 6173 of the conductor 617.

In use, when a user's finger touches and/or presses the first area of one of the sections of the pressing portion 613 (corresponding to the second end of one of the conductors 617), the sensor 615 receives the signal of change of capacitance transmitted by the corresponding conductive cover 6193 and the conductor 617, and transmits the signal to the controller 165. If the first area of one of the sections of the pressing portion 613 is only touched and not pressed, the controller 165 controls the key structure 200 to act as a touch key. If the first area of one of the sections of the pressing portion 613 is physically pressed, the controller 165 controls the key structure 200 to act as a mechanical key. When the user's finger touches the second area of one of the sections of the pressing portion 613 (corresponding to one of the conductors 617), the key structure 200 acts as a touch key and has the function of a touch key, in much the same way as that described above in relation to the second exemplary embodiment.

The key structure 200 can be applied in various portable and small electronic devices, such as video phones, internet phones, and so on. When the key structure 200 acts as a mechanical key, the pressing portion 613 may be pressed to function as a number key. When the key structure 200 acts as a touch key, the pressing portion 613 may be touched to function as a selection key for flipping a menu. For example, a portable electronic device includes a plurality of key structures 200, and the pair of conductors 617 of each key structure 200 are electrically isolated from the pair of conductors 617 of every other key structure 200. Correspondingly, at the outside surface of the housing 166, the two sections of the pressing portion 613 of each key structure 200 are physically isolated from the two sections of the pressing portion 613 of every other key structure 200. Each key structure 200 is connected to the controller 165. The controller 165 detects a direction of movement of a sliding touching action of a user's finger, by sensing the order of changes of capacitance across the plurality of key structures 200, and controls the portable electronic device to carry out corresponding actions set by software in the portable electronic device. In detail, if a user's finger slidingly touches the portable electronic device from the pressing portion 613 of a first key structure 200 to the pressing portion 613 of a second key structure 200, the controller 165 receives a change of capacitance of the first key structure 200 earlier than a change of capacitance of the second key structure 200, and as a result, the controller 165 may carry out a page-flipping action, for example from a first page to a second page. Conversely, if the user's finger slidingly touches the portable electronic device from the pressing portion 613 of the second key structure 200 to the pressing portion 613 of the first key structure 200, the controller 165 receives the change of capacitance of the second key structure 200 earlier than the change of capacitance of the first key structure 200, and as a result, the controller 165 may carry out another page-flipping action, for example from the second page back to the first page.

Descriptions of exemplary embodiments of the electronic reader device 100 comprising the key structure 200 are given in the following sections:

1. System Overview
   1.1 Exemplary electronic reader device
   1.2 Structure of physical control
2. Graphical User Interface (GUI) Control Method
   2.1 Icon characteristics
   2.2 Exemplary operation
3. Alternative Embodiments
   3.1 Alternative configurations of touch sensors
   3.2 Additional contact operations
4. Conclusion
1. System Overview The disclosed electronic reader device 100 can be implemented as a standalone device or integrated in various electronic devices, such as a cell phone, a tablet personal computer (PC), a laptop computer, a monitor, a multimedia player, a digital camera, a set top box, a personal digital assistant (PDA), a navigation device or a mobile internet device (MID).

1.1 Exemplary Electronic Reader Device

With reference to FIG. 7, a processor 151 comprises a central processing unit of the electronic reader device 100. The processor 151 comprises various integrated circuits (ICs) for processing data and machine-readable instructions. A communication unit 156 establishes wireless communication channels, through which the electronic reader device 100 may connect to and download e-books for example. The communication unit 156 may comprise antennas, and base band and radio frequency (RF) chipsets for wireless local area network communication and/or cellular communication such as wideband code division multiple access (W-CDMA) and high speed downlink packet access (HSDPA). The processor 151 may be packaged as a chip or comprise a plurality of chips interconnected through buses. For example, the processor 151 may only comprise a central processing unit (CPU); or may comprise a combination of a CPU, a digital signal processor (DSP), and a chip of a communications controller such as a chip of the communication unit 156. The communications controller may comprise a controller of a cellular communication device, an infrared communication device, a Bluetooth™ communication device, or a wireless local area network (LAN) communication device. The communication controller coordinates communication among components of the electronic reader device 100 or communication between the electronic reader device 100 and external devices.

A power supply 158 provides electrical power to components of the electronic reader device 100. A crystal oscillator 159 provides clock signals to the processor 151 and other components of the electronic reader device 100. The connections of the components in the electronic reader device 100 are shown in FIG. 7, and may be serial or parallel transmission buses. Input and output (I/O) units 160 may comprise control buttons, an alphanumeric keypad, a touch panel, a touch screen, and a plurality of light emitting diodes (LEDs). The controller 165 detects operations on the I/O units 160 and transmits signals indicative of the detected operations to the processor 151. The controller 165 also controls operations of the I/O units 160. The processor 151 may control the I/O units 160 through the controller 165. Ports 164 may be used to connect to various computerized interfaces, such as to an external computer or to a peripheral device. The ports 164 may comprise physical ports complying with universal serial bus (USB) and IEEE 1394 standards.

Nonvolatile memory 153 stores an operating system and applications executable by the processor 151. The processor 151 may load runtime processes and data from the nonvolatile memory 153 to the main memory 152 and store digital content in a mass storage device 154. The electronic reader device 100 may obtain digital content such as e-books from the communication unit 156. The main memory 152 may comprise a random access memory (RAM), such as static RAM (SRAM) or dynamic RAM (DRAM). The nonvolatile memory 153 may comprise an electrically erasable programmable read-only memory (EEPROM) or a flash memory, such as a NOR flash or a NAND flash.

An audio output unit 161 comprises a digital to analog converter, which converts audio signals output by the processor 151 from digital format to analog format.

A display 155 displays text and images, and may comprise a reflective display, such as an electrophoretic display, an electrofluitic display, or a display using interferometric modulation. Alternatively, the display 155 may comprise e-paper, a display made up of organic light emitting diodes (OLEDs), a field emission display (FED), or a liquid crystal display (LCD). The display 155 may display various graphical user interfaces (GUIs) as virtual controls, including but not limited to windows, scroll bars, icons, and clipboards. The display 155 may comprise a single display or a plurality of displays in different sizes. The processor 151 may present various GUIs on the display 155 as detailed in the following paragraphs.

The electronic reader device 100 comprises the housing 166 structured to include the components thereof.

The I/O units 160 comprise a touch sensor 167 operable to detect touches on the display 155. The touch sensor 167 may comprise a transparent touch pad overlaid on the display 155 or arrays of optical touch transmitters and receivers located on the border of the display 155, such as those disclosed in US patent publication No. 2009/0189878.

Figure 8:
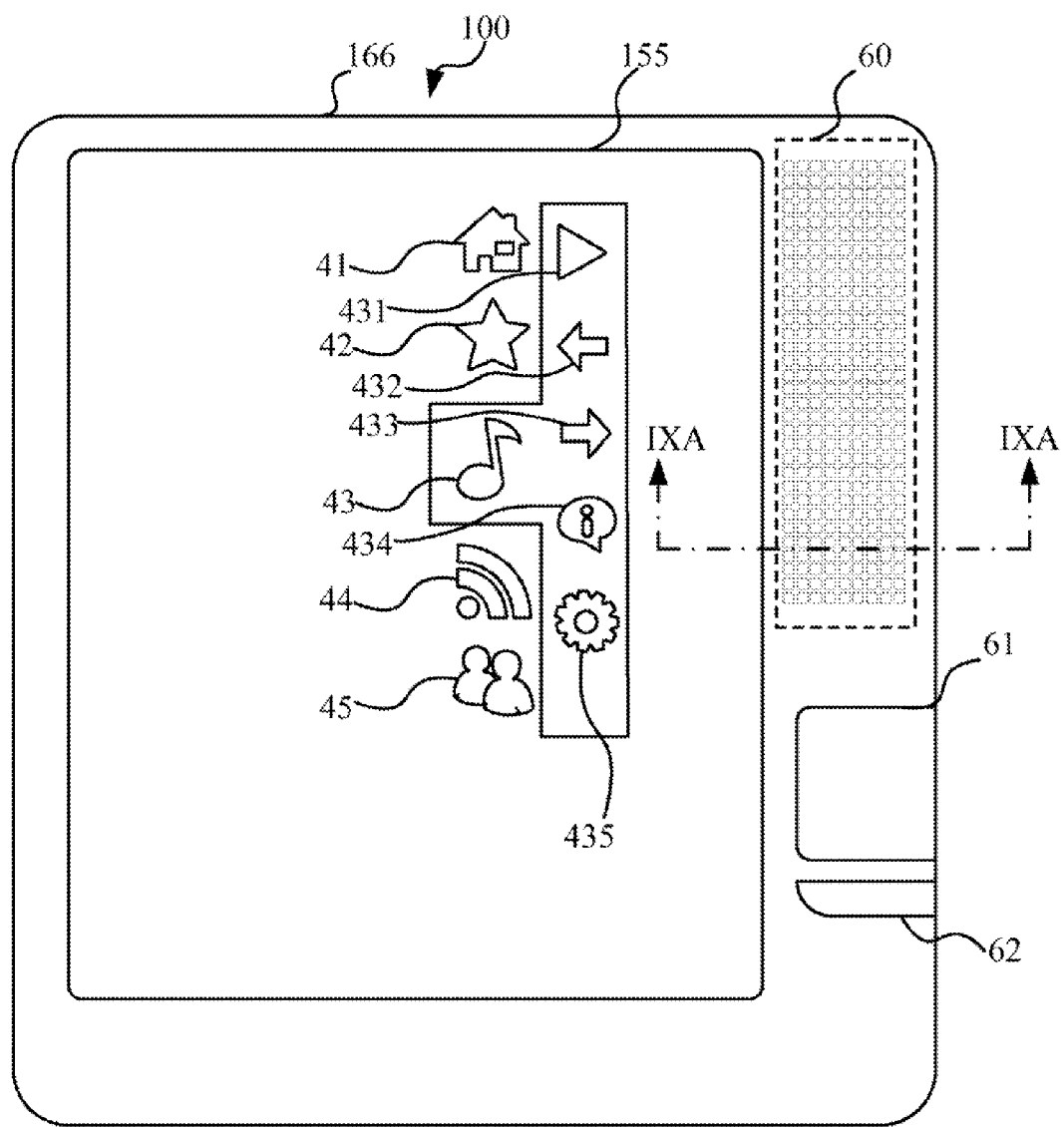
FIG. 8 is a top view of the exemplary embodiment of the electronic reader device.

With reference to FIG. 8, the electronic reader device 100 comprises the housing 166 in which the components of the electronic reader device 100 are integrated. Physical controls of the I/O units 160 comprise a control module 60, a touch pad 61, and a key 62, all of which are incorporated in a portion of the electronic reader device 100 adjacent to a frame of the display 155. Thus, the display 155, the control module 60, the touch pad 61, and the key 62 are disposed on a first surface of the electronic reader device 100 and form a portion of the housing 166 of the electronic reader device 100. The touch pad 61 is operable to turn pages of an e-book. The key 62 is operable to show a menu on the display 155. The control module 60 comprises activation points, each of which is operable to trigger an operation associated with that activation point upon receiving a press or a touch thereon. Each of the activation points may be initially associated with a default operation. The display 155, the control module 60, the touch pad 61, and the key 62 are disposed on a first surface and form a portion of the housing 166 of the electronic reader device 100. The key structure 200 can be applied to the touch pad 61 and the key 62, so that the key structure 200 is a combination of the touch pad 61 and the key 62. In such case, the key structure 200 is operable to turn pages of the e-book by simple touches and show a menu on the display 155 with fingertip pressure.

1.2 Structure of Physical Control

Figure 9A:
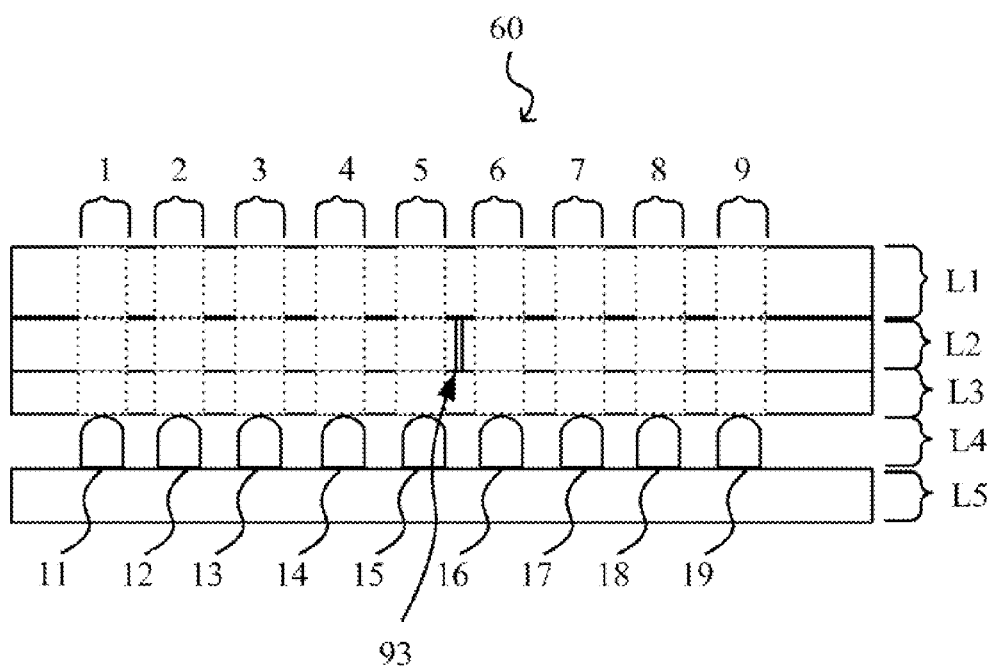
FIG. 9A is an enlarged cross-section of a physical control module of the electronic reader device of FIG. 8, taken along line IXA-IXA thereof.
Figure 9B:
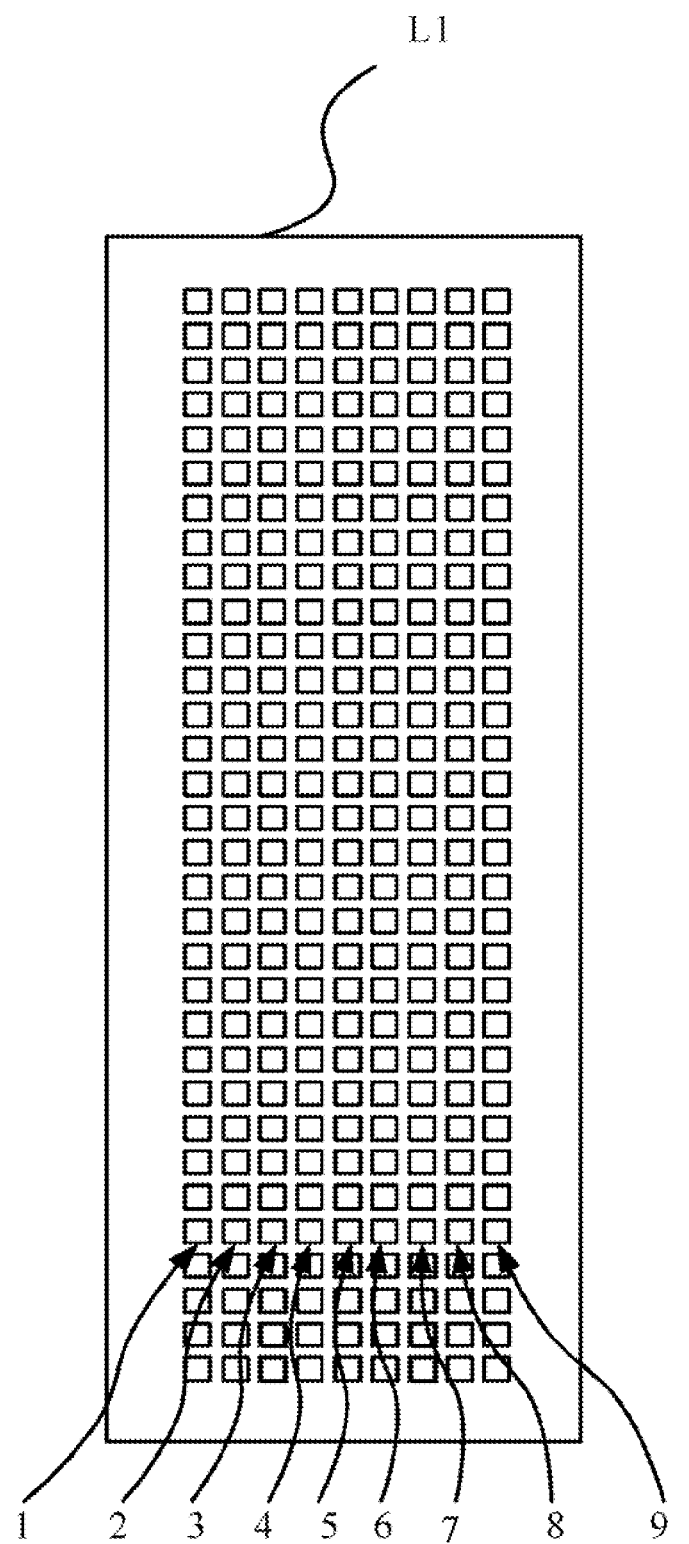
FIGS. 9B-9F are schematic diagrams of various layers of the exemplary embodiment of the physical control module.

FIG. 9A is an enlarged cross-section of the control module 60, taken along line IXA-IXA of FIG. 8. The control module 60 comprises layers L1-L5. With reference to FIGS. 9A and 9B, the layer L1 forms a top cover of the control module 60 with an array of transparent windows, among which windows 1-9 are shown in FIG. 9A. Windows in addition to the windows 1-9 are shown as similar squares in FIGS. 9B-9D, but without labels. Windows on the layer L2 are aligned with the windows on the layer L1, windows on the layer L3 are aligned with the windows on the layer L2, and the windows on the layer L3 are also aligned with lamps on the layer L4. FIG. 9F shows the lamps in the layer L4 as similar circles, and lamps 11-19 are thus shown in FIG. 9A. The windows on the layers L1-L3 may be filled with transparent dielectric materials, such that the lamps in the layer L4 may provide illumination through the windows.

Figure 9C:
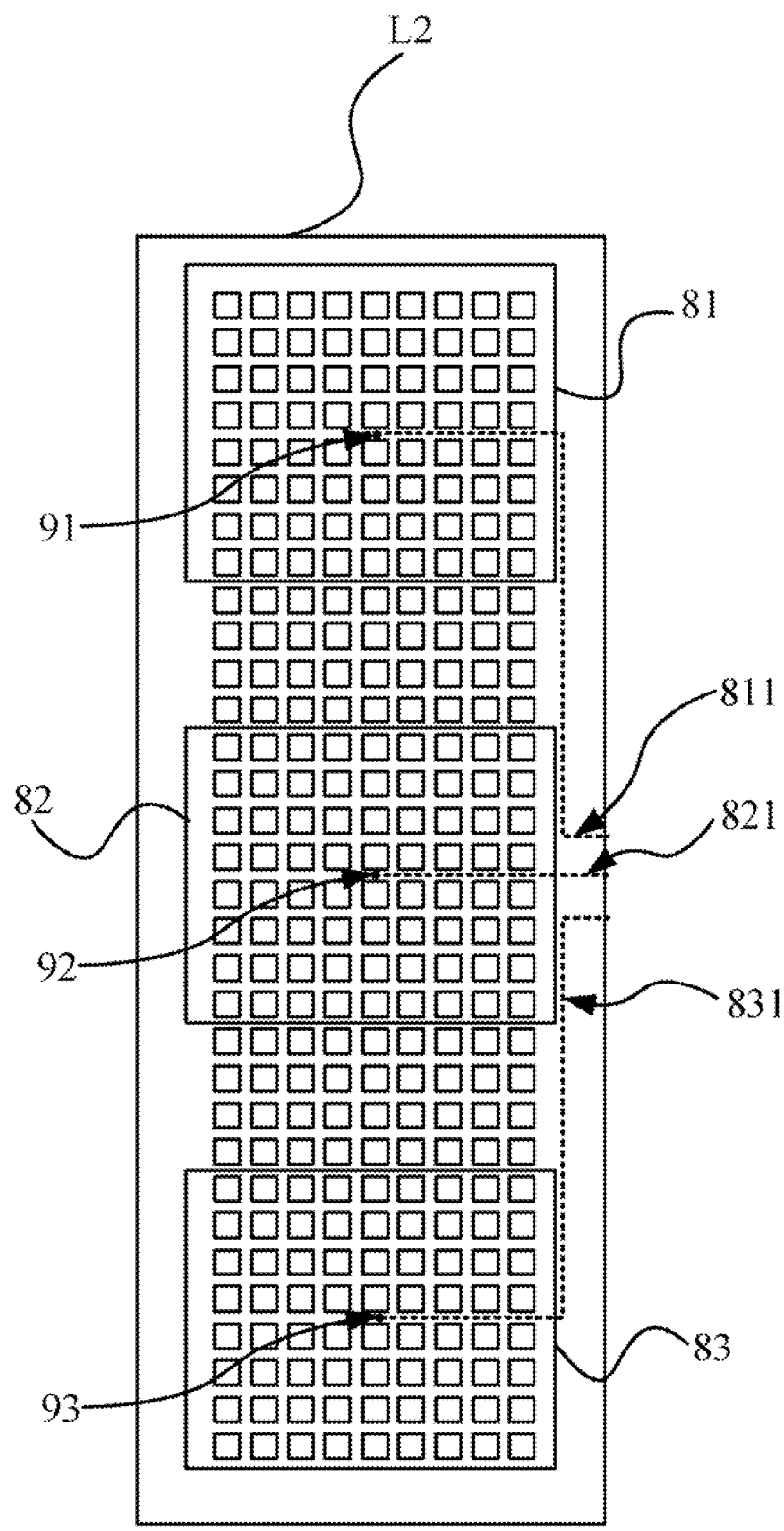

FIG. 9C shows the upper surface of the layer L2. The layer L2 is comprised in a printed circuit board (PCB) on which three printed metallic areas 81-83 are formed, wherein each of the printed metallic areas 81-83 acts as a detection pad. Each of the detection pads 81-83 comprises an array of openings to form a plurality of windows. Vias 91, 92, and 93 in the layer L2, represented by round points in FIG. 9C, are formed by the centers of the detection pads 81-83 being filled with conductive material such as tin. Buses 811, 821, and 831 which are connected to the detection pads 81-83 are formed on the lower surface of the layer L2, and are represented by dotted lines in FIG. 9C.

Figure 9D:
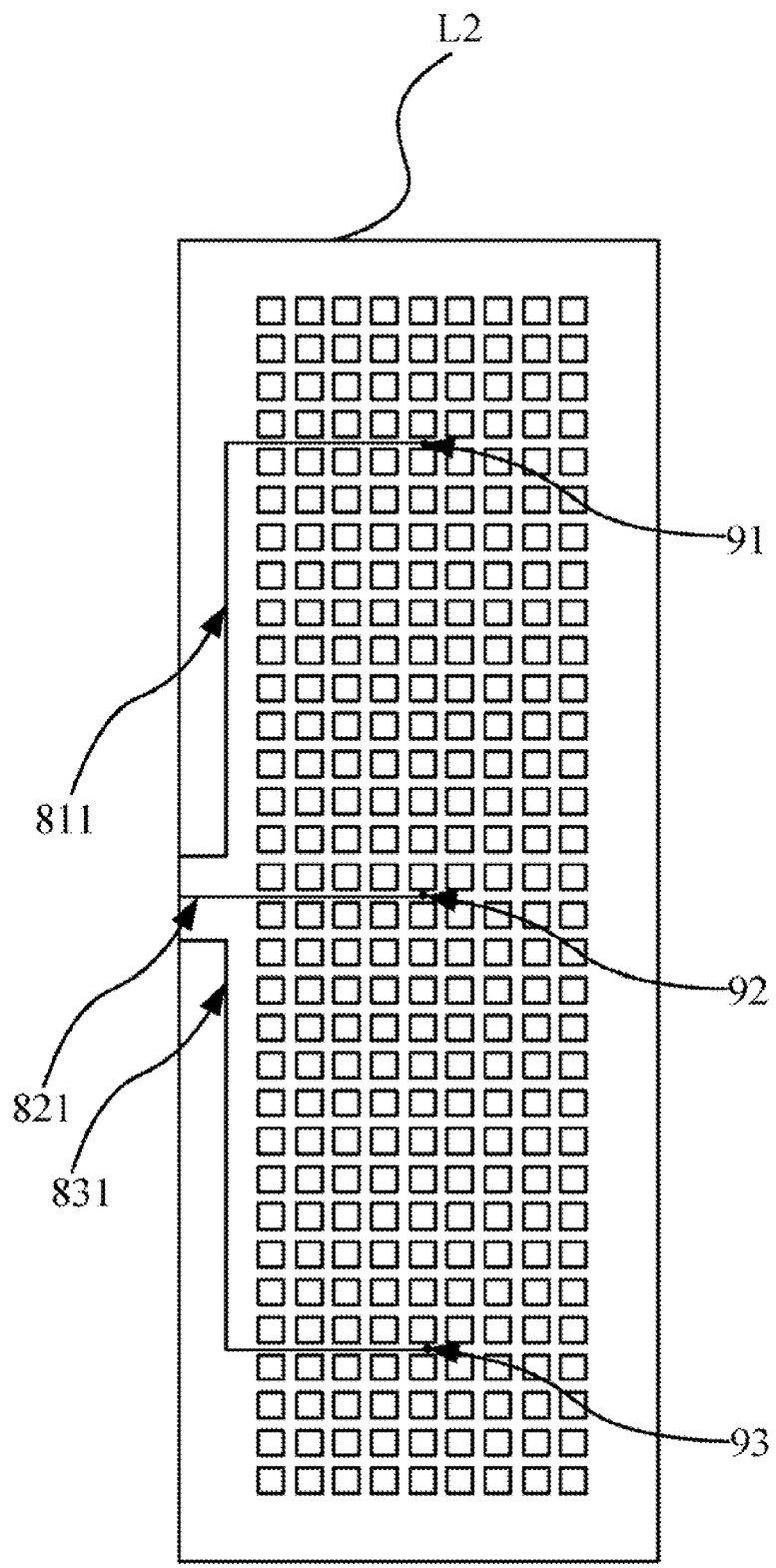

With reference to FIG. 9D, the buses 811, 821, and 831 of the detection pads 81-83 are formed on the lower surface of the layer L2 and connected to the detection pads 81-83 through the vias 91, 92, and 93 respectively. Each of the buses 811, 821, and 831 has one end connected to one of the detection pads 81-83 and the other end connected to the controller 165. The controller 165 detects touches in proximity to an operating point of the control module 60 by determining capacitance changes of at least one of the detection pads 81-83. Alternatively, the controller 165 may detect contact operations in proximity to an operating point of the control module 60 by determining changes in thermal or biological parameters through at least one of the detection pads 81-83.

Figure 9E:
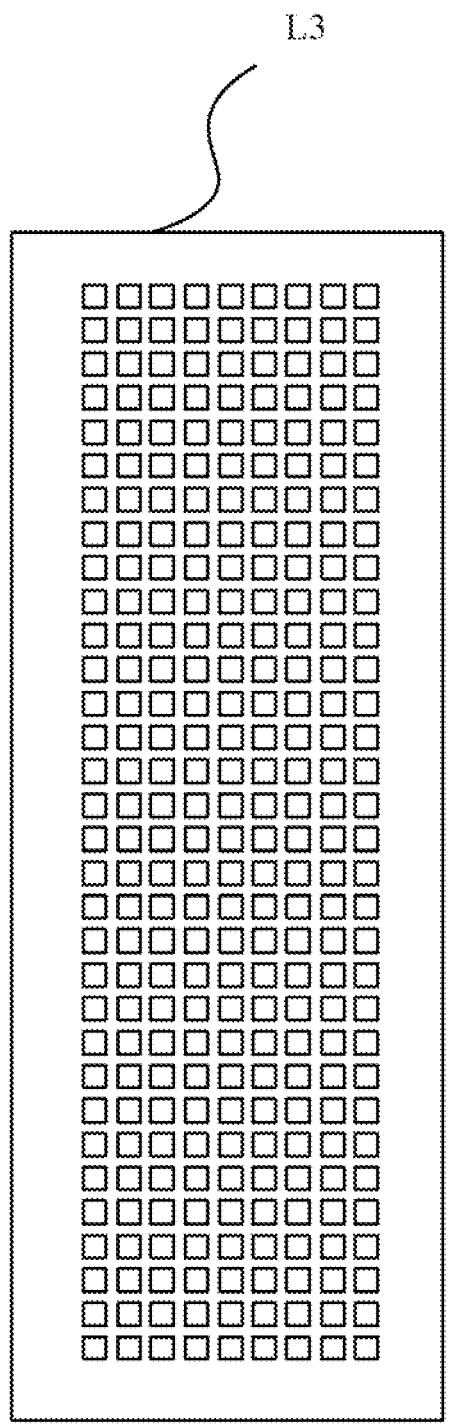
Figure 9F:
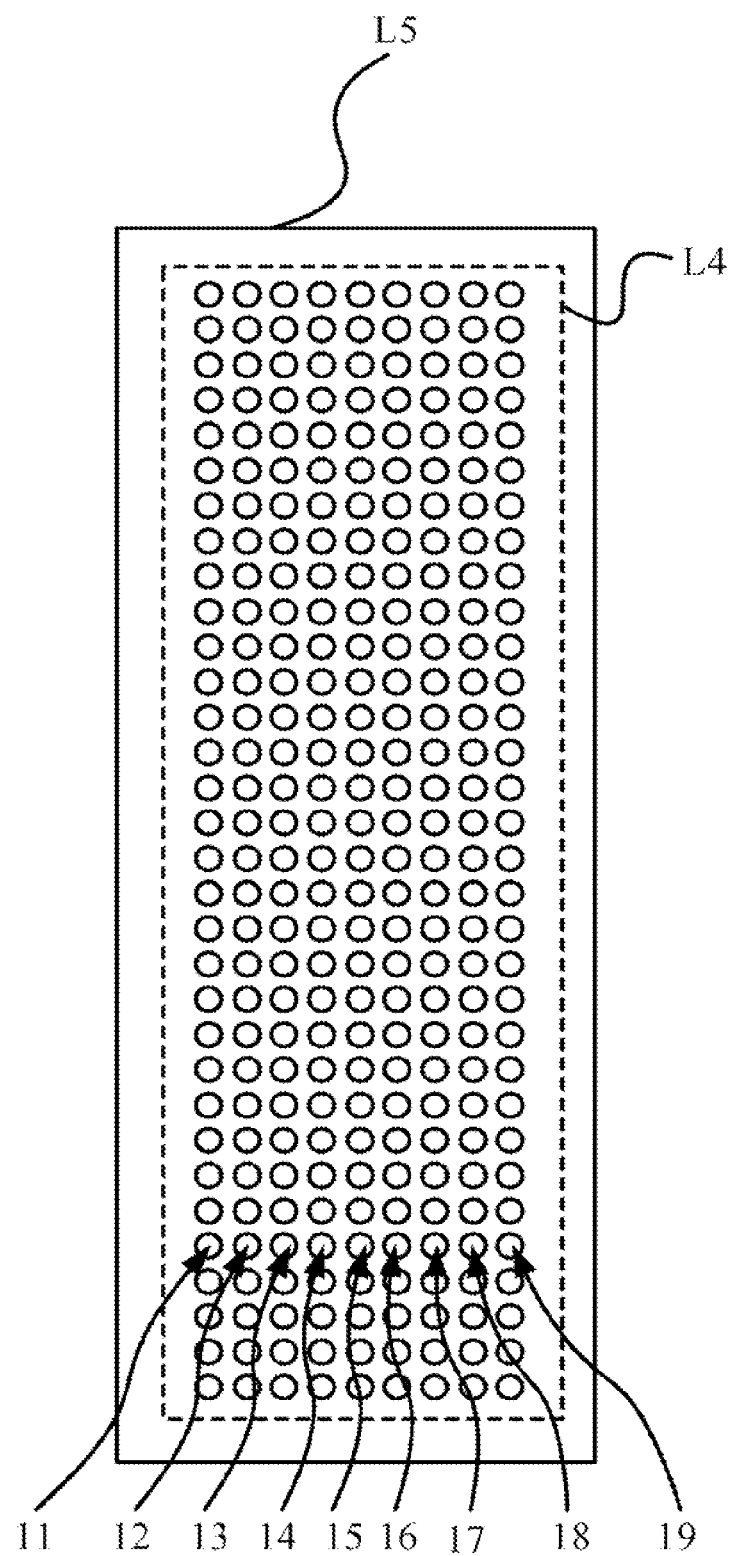

With reference to FIG. 9E, the layer L3 comprises a dielectric layer, which may constitute another layer of the printed circuit board of which the layer L2 is a part. An array of windows are formed in the dielectric layer, and are aligned with the windows on the layer L2. In FIG. 9F, lamps in the layer L4 are formed as lamp arrays on the upper surface of the layer L5, and are aligned with the windows on the layer L3. The lamps on the layer L5 may be LEDs or OLEDs. Buses connecting the lamps are also formed on the layer L5. A distance between any two of the detection pads 81-83 exceeds the thickness of the layer L1. In one embodiment, the layer L5 is comprised in its own printed circuit board, such that the layers L2 and L5 are comprised in respective printed circuit boards.

Figure 9G:
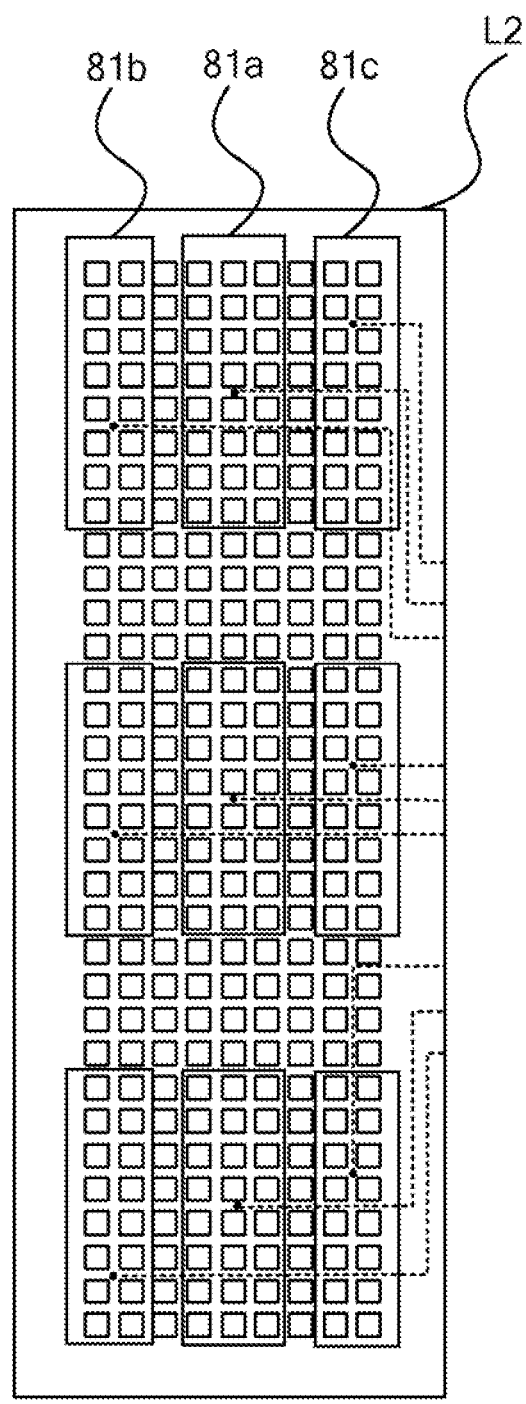
FIG. 9G is an alternative embodiment of a second one of the layers of the physical control module.

Additional detection pads may be formed on the layer L2. An operating point of the control module 60 may be associated with a group of detection pads. For example, FIG. 9G shows another embodiment of the layer L2, wherein components such as vias and traces are represented with respect to FIG. 9C. An operating point of the control module 60 is associated with three detection pads, in which a central detection pad (such as 81a) and a left detection pad (such as 81b) and a right detection pad (such as 81c) thereof are connected to the controller 165 through vias and traces. As more than one detection pad are grouped together to correspond to a single operating point on the control module 60, the controller 165 detects any direction of movement of a contact operation on an operating point by determining the order of detection pad activation in a detection pad group.

2. Graphical User Interface (GUI) Control Method

The electronic reader device 100 may provide a plurality of functions, and a plurality of display icons corresponding to the plurality of functions.

2.1 Icon Characteristics

The status or appearance of an icon may indicate events received or generated by the program associated with the icon. The processor 151 may update an icon status shown by the lamps of the control module 60 to synchronize with program events or statuses associated with the icon when the display 155 shows another program in the foreground, or is turned off.

The status of an icon may comprise at least three states, such as "on," "off," and "animated." The "on" state of an icon may comprise a plurality of sub-states representing statuses of the program functions associated with the icon. For example, the sub-states may represent the functions of execution/suspension, service signing in/off, communication channel connection/disconnection, and other functions. The "off" state of an icon indicates that the electronic reader device 100 is in a suspension mode. The "animated" state of an icon indicates message delivery from a function or program associated with the icon.

With reference to FIG. 8, icons 41-45 respectively correspond to the functions of returning to a main page, showing a favorite collection folder (typically referred to as "My Favorites"), launching a music player program, a really simple syndication (RSS) reader, and an Internet messaging application. Icons 431-435 correspond to individual optional functions of the music player program associated with the icon 43. The icon 431 corresponds to resumption or suspension of music playback. The icons 432 and 433 respectively correspond to backward and forward playback. The icon 434 corresponds to showing a GUI relating to an information query. The icon 435 corresponds to showing a GUI of music player configurations. When detecting a touch condition to activate an icon shown in FIG. 8, the processor 155 performs a function corresponding to the activated icon.

Figure 10:
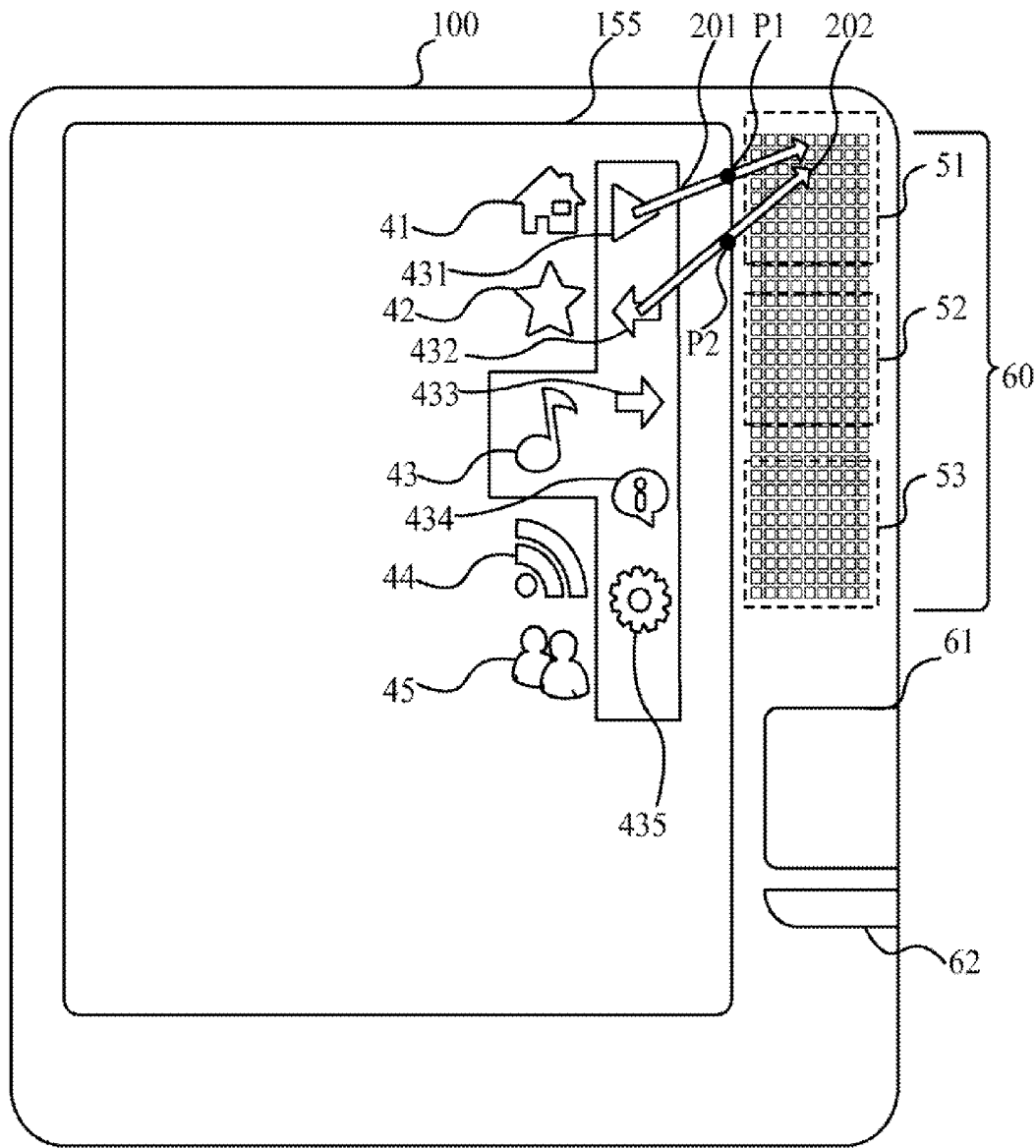
FIG. 10 is a schematic diagram showing exemplary drag operations of icons on the electronic reader device.

With reference to FIG. 10, areas 51-53 on the control module 60 are each in respective proximity to the detection pads 81-83. Each of the areas 51-53 serves as an operating point of the control module 60 which when activated triggers the electronic reader device 100 to perform one or more functions associated with the operating point. Upon detecting contact, the controller 165 may interpret the contact operation on one operating point as activation of the operating point. As each of the areas 51-53 may initially be associated with no function, lamps in the areas 51-53 may correspondingly be initially off, whereby no outline or image of an icon is shown in the areas 51-53.

2.2 Exemplary Operation

Figure 11:
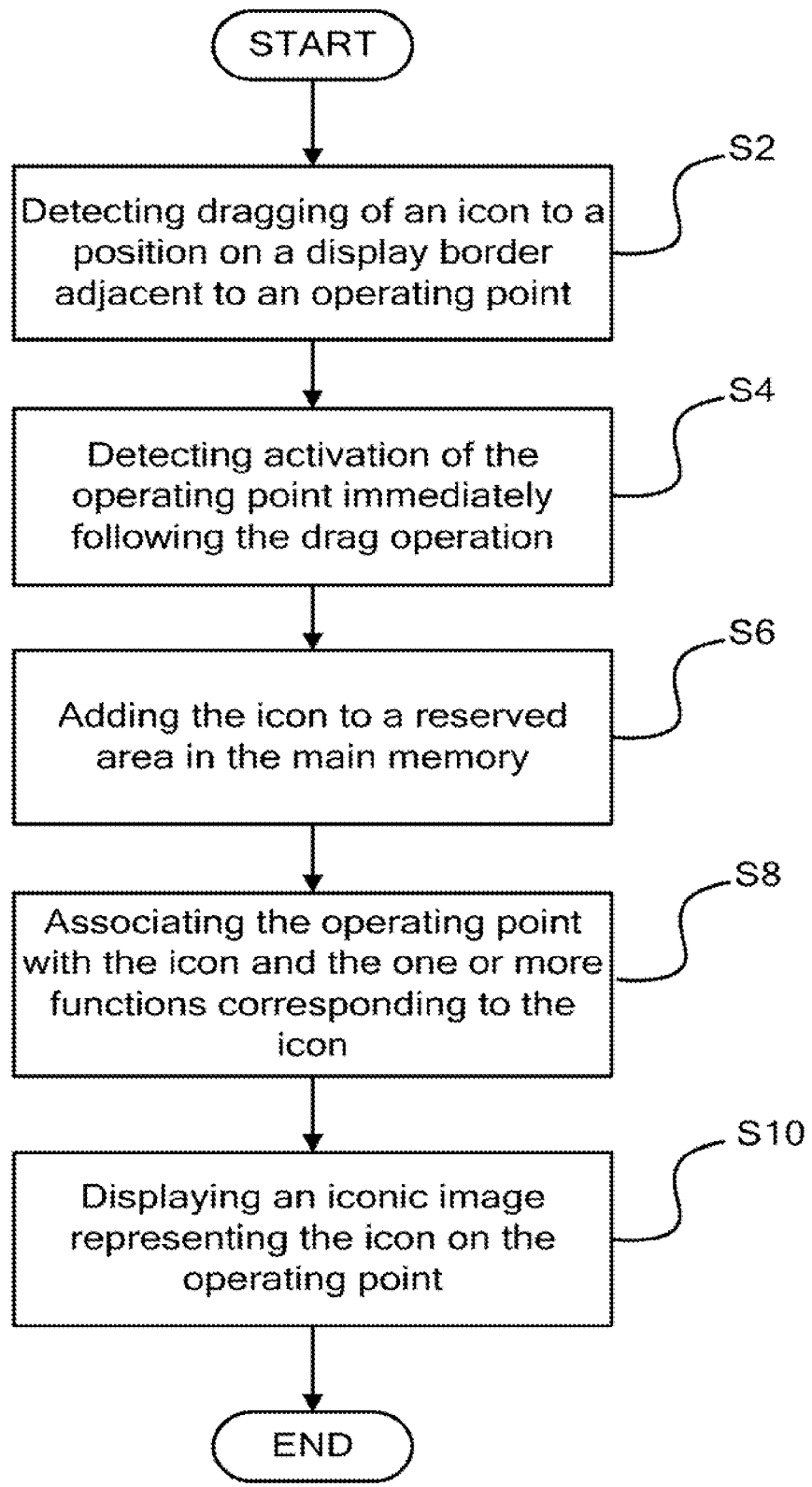
FIG. 11 is a flowchart of an exemplary embodiment of a graphical user interface (GUI) control method.

With reference to FIG. 11, in an exemplary GUI control method, the processor 151 can detect two events. The events are a drag operation that moves an icon to a position on a border of the display 155 close to an operating point of the control module 60 (step S2), and an activation of the operating point of the control module 60 immediately following the drag operation (step S4). The drag operation may begin from an original position of the icon to a point within a predetermined proximity to one of the operating points, such as one of the areas 51-53, thus causing the detected events in steps S2 and S4. The processor 151 adds the icon to a reserved area in the main memory 152 (step S6), associates the icon and one or more functions corresponding to the icon with the operating point (step S8), and switches on a portion of lamps in the area of the operating point to show an iconic image representing the icon on the operating point in response to steps S2 and S4 (step S10). If the operating point has an original association with a default function of a default icon before step S2, the processor 151 replaces the original association of the operating point and the default function with the association generated in step S8. The processor 151 may represent the association by data stored in the main memory 152 or in the nonvolatile memory 153. The processor 151 may determine that the activation of the operating point immediately follows the drag operation if occurrence of the operating point activation in step S4 is no later than a predetermined time period D from the time when an ending point of the drag operation on the display 155 is detected in step S2. The processor 151 presents the iconic image as a copy of the icon, and does not remove the icon from the display 155 after the drag operation.

The processor 151 may determine the drag operation of the icon as a drag operation requiring display of an iconic image representing the icon if the end point of the drag operation on the border of the display 155 is within a certain proximity of an operating point. The processor 151 may execute steps S6, S8, and S10 in response to a determination that the drag operation requires display of an iconic image representing the icon.

Figure 12:
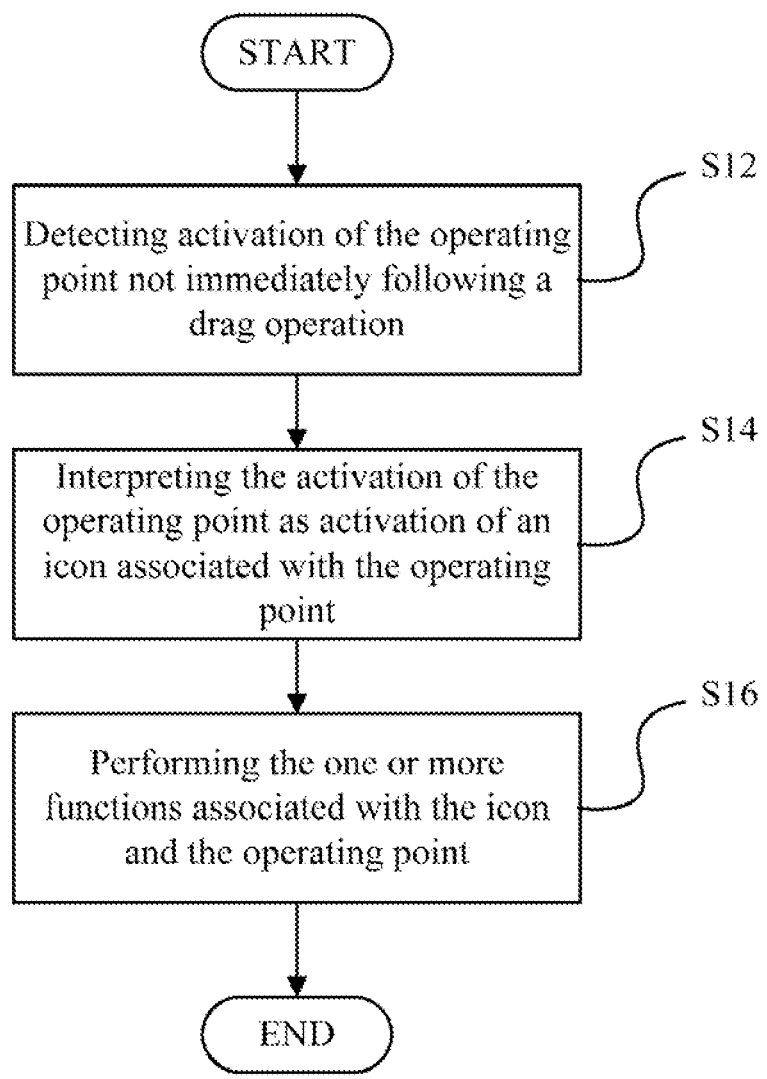
FIG. 12 is a flowchart of an exemplary embodiment of operating point activation of the physical control module.

With reference to FIG. 12, in an exemplary operating point activation method, when receiving activation of the operating point (step S12), the processor 151 interprets the activation of the operating point as an activation of an icon associated with the operating point (step S14), and performs the one or more functions currently associated with the icon and the operating point (step S16). In step S12, the activation of the operating point does not immediately follow a drag operation. The processor 151 updates the iconic image on the activated operating point to synchronize the appearance of the image with the icon associated with the operating point.

Figure 13:
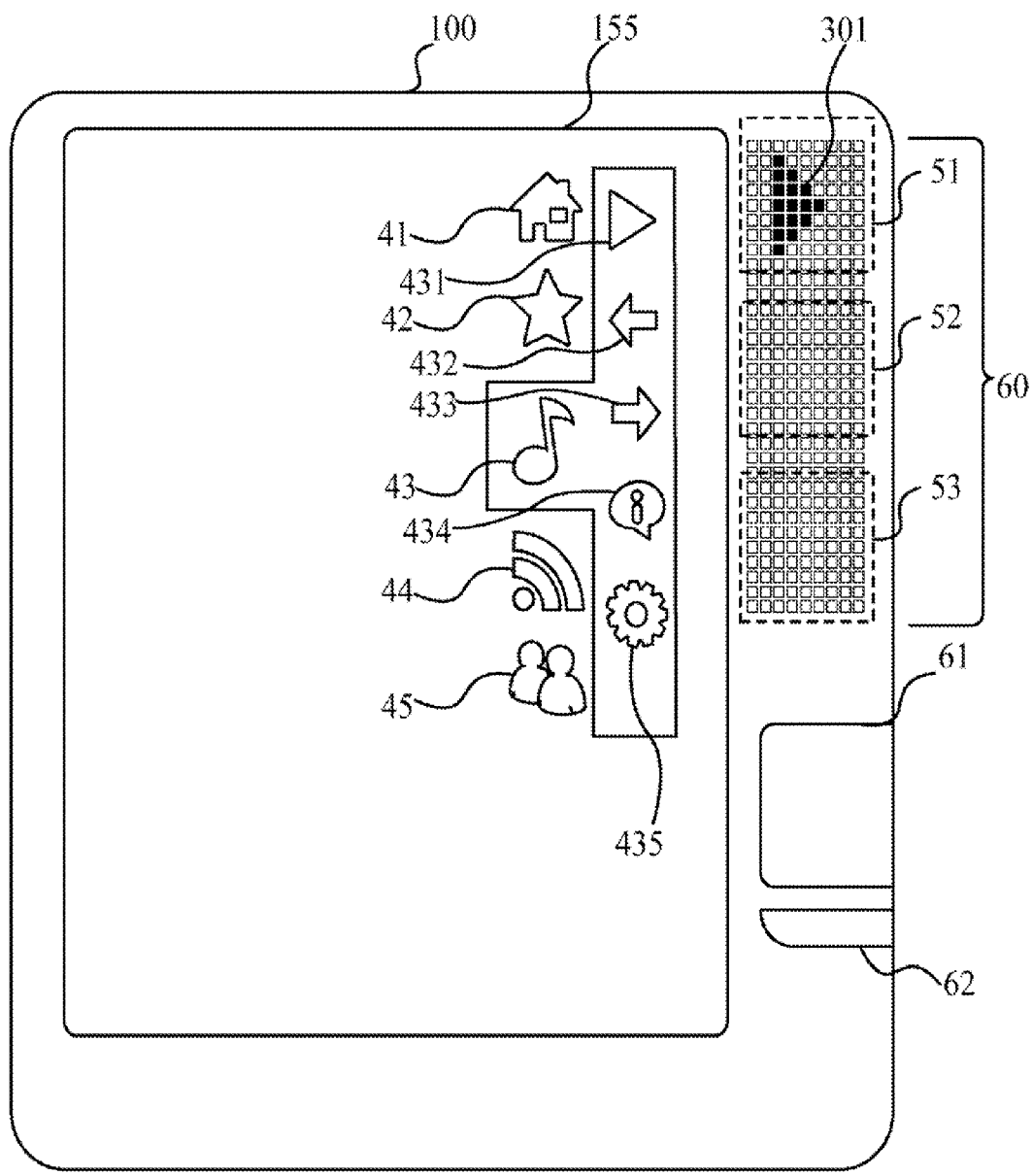
FIGS. 13-15 are schematic diagrams of exemplary embodiments of the electronic reader device with different icons shown on the physical control module.
Figure 14:
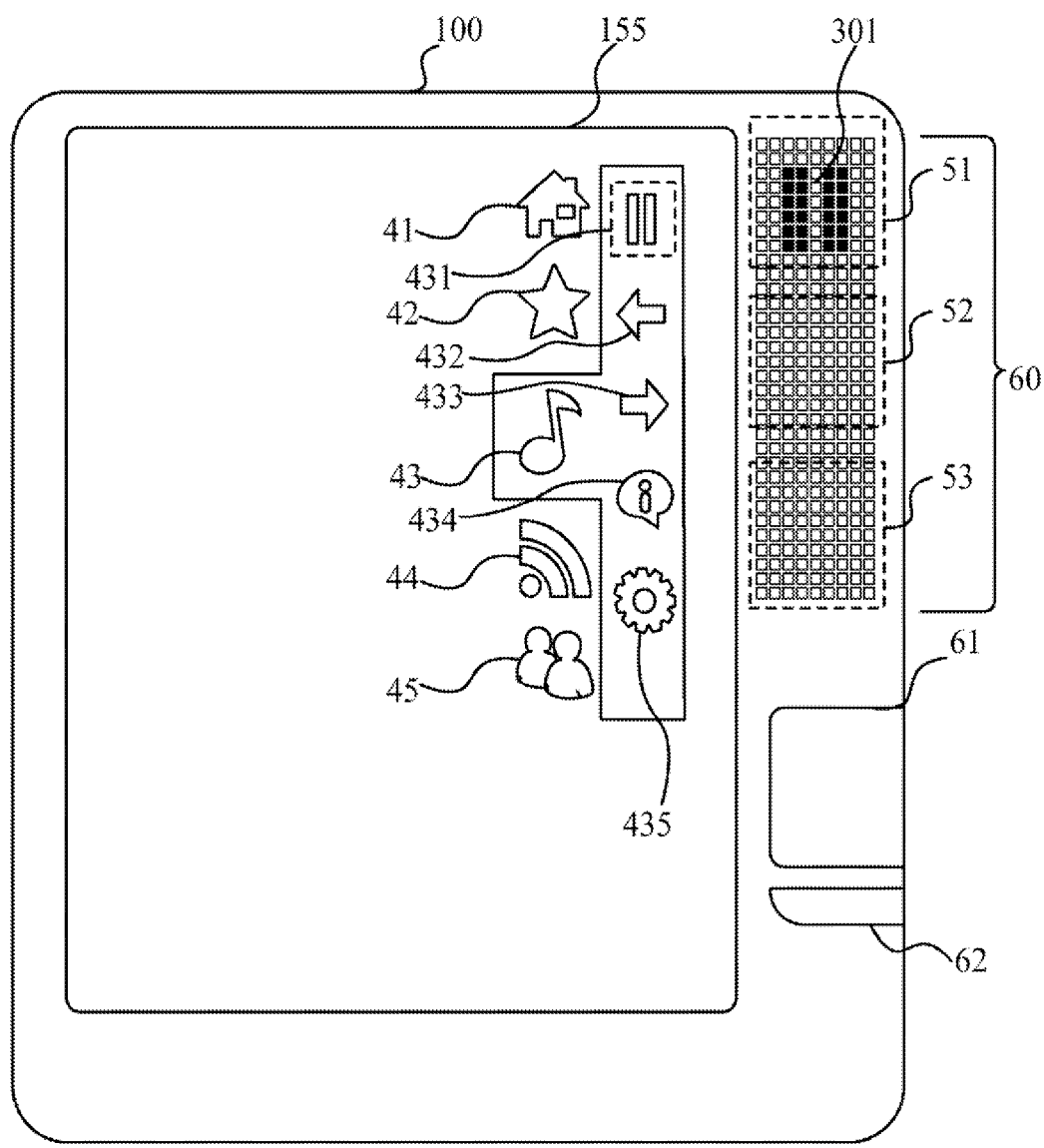

With reference to FIG. 10, for example, when detecting a first drag operation 201 that moves the icon 431 to a position P1 on a border of the display 155 close to the operating point of the area 51 (step S2), and then detecting an activation of the operating point of the area 51 immediately following the first drag operation 201 (step S4), the processor 151 adds the icon 431 to a reserved area in the main memory 152 (step S6), associates music playback resumption and suspension functions of the icon 431 with the operating point of the area 51 to establish a first association (step S8), and switches on a portion of lamps in the area 51 to show an iconic image 301 representing the icon 431 in response to the detection (step S10), as shown in FIG. 13. Subsequently, when receiving activation of the operating point of the area 51 (step S12), the processor 151 according to the first association interprets the activation of the operating point as an activation of the icon 431 associated with the operating point (step S14), and performs the music playback resumption function associated with the operating point (step S16). The icon 431 may change appearance according to the one or more functions performed. The processor 151 may control the lamps in the area 51 to synchronize the appearance of the iconic image 301 with the icon 431. As shown in FIG. 14, for example, after step S14 takes place, the appearances of the icon 431 and the image in the area 51 synchronously change to represent the suspension function.

Data representing an association of an operating point, an icon, and one or more functions of the icon may comprise identification information of each of the associated operating point, icon, and one or more functions in the association. For example, data representing an association of the operating point of the area 51, the icon 431, and music playback resumption and suspension functions of the icon 431 may comprise identification information of each of the operating point of the area 51, the icon 431, and the music playback resumption and suspension functions of the icon 431.

In an alternative embodiment, the processor 151 may smoothly display movement of the icon 431 along a track of the first drag operation 201 in step S2; and when the first drag operation 201 reaches the position P1, the processor 151 automatically continues the movement of the icon 431 beyond the position P1 according to the moving speed and direction of the icon 431 at the position P1 for the predetermined time period D. In such case, there is no need for the user to activate the operating point of the area 51 immediately following the first drag operation 201. That is, step S4 of FIG. 11 is omitted.

Figure 15:
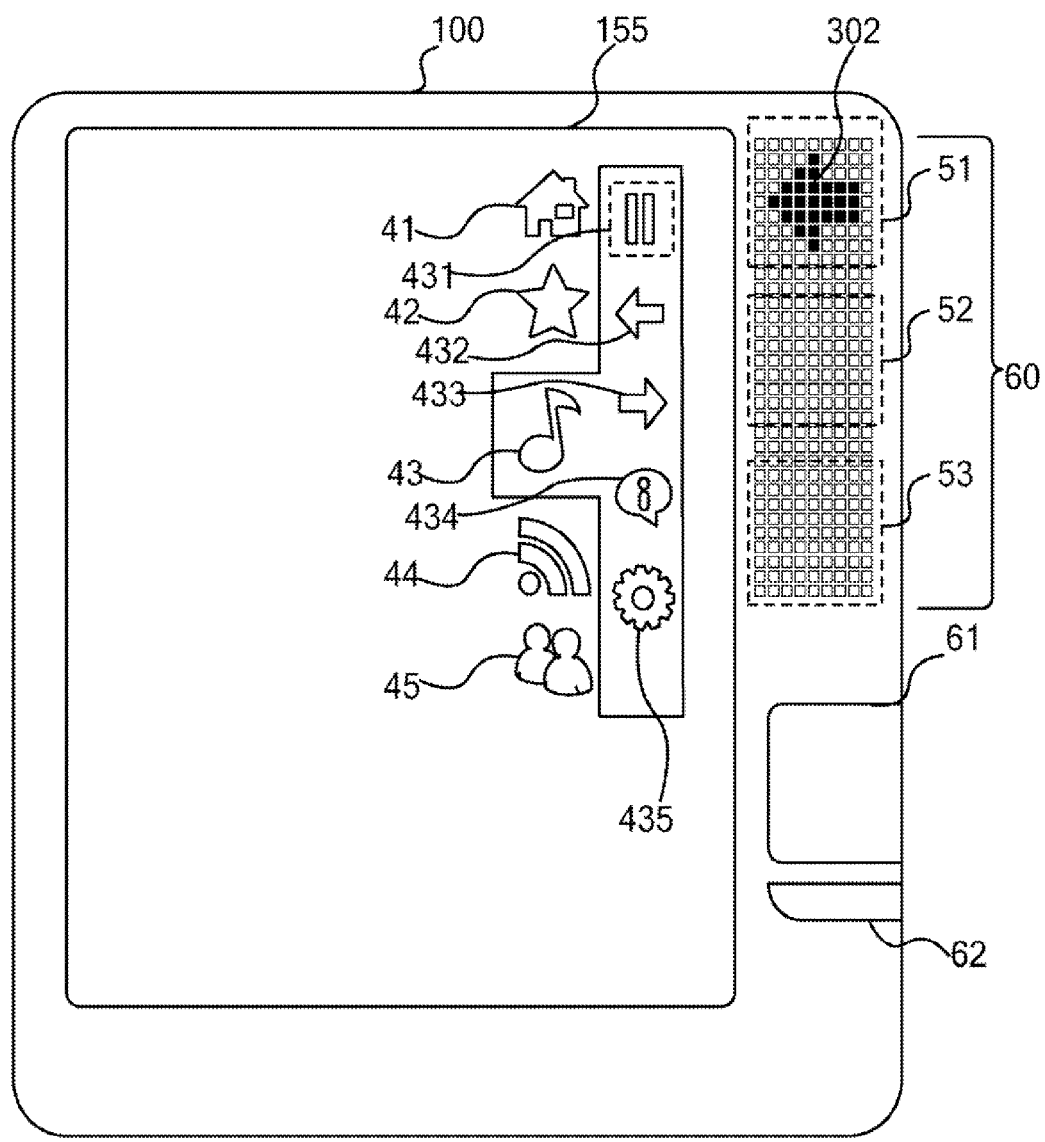

With reference to FIG. 10, in a further example, which takes place after the appearances of the icon 431 and the image in the area 51 have synchronously changed to represent the suspension function, is as follows. When detecting a second drag operation 202 that moves the icon 432 to a position P2 on a border of the display 155 adjacent to the operating point of the area 51 (step S2) and an immediate activation of the operating point of the area 51 following the second drag operation (step S4), the processor 151 adds the icon 432 to a reserved area in the main memory 152 (step S6), associates backward music playback function of the icon 432 with the operating point of the area 51 to establish a second association (step S8), and switches on a portion of lamps in the area 51 to show an iconic image 302 (shown in FIG. 15) representing the icon 432 (step S10). The processor 151 replaces the first association between the operating point 51 and the icon 431 with the second association between the operating point 51 and the icon 432. Subsequently, when receiving activation of the operating point of the area 51 (step S12), the processor 151 interprets the activation of the operating point as an activation of the icon 432 associated with the operating point of the area 51 (step S14), and performs the backward music playback function associated with the operating point according to the second association (step S16).

3. Alternative Embodiments 3.1 Alternative Configurations of Touch Sensors

Light guide components, such as optical fibers, may be utilized to connect each lamp to a corresponding window on a detection pad, thus eliminating interference between the lamps and the detection pads. The dimensions of each window on the control module 60 may be as small as a cross-sectional area of an optical fiber. Alternatively, as one end of an optical fiber is connected to a window on the control module 60, the other end of an optical fiber may be connected to one or more pixels of the display 155. Thus, an area of the display 155 comprising the fiber-connected pixels is reserved for the functions of the control module 60.

With reference to FIG. 16, infra-red LEDs and photodiode (PD) receivers as disclosed in US patent publication No. 2009/0189878 may be utilized by the electronic reader device 100. Infra-red LEDs are represented by similar circles with stripes, and PD receivers are represented by similar circles without stripes. Infra-red LEDs 600 are arranged as a vertical array adjacent to a left edge of the display 155, and PD receivers 500 operable to receive light beams transmitted by the LEDs 600 are arranged as a vertical array adjacent to a right edge of the control module 60. Infra-red LEDs 610 are arranged as a horizontal array adjacent to lower edges of the display 155 and the control module 60, and PD receivers 510 operable to receive light beams transmitted by the LEDs 610 are arranged as a horizontal array adjacent to upper edges of the display 155 and the control module 60. The processor 151 may utilize the LEDs 600, 610 and PD receivers 500, 510 to detect contact operations in an area enclosed by these LEDs 600, 610 and PD receivers 500, 510. For example, the LEDs 600, 610 and PD receivers 500, 510 may be fixed to an inner surface of the housing 166.

Figure 17:
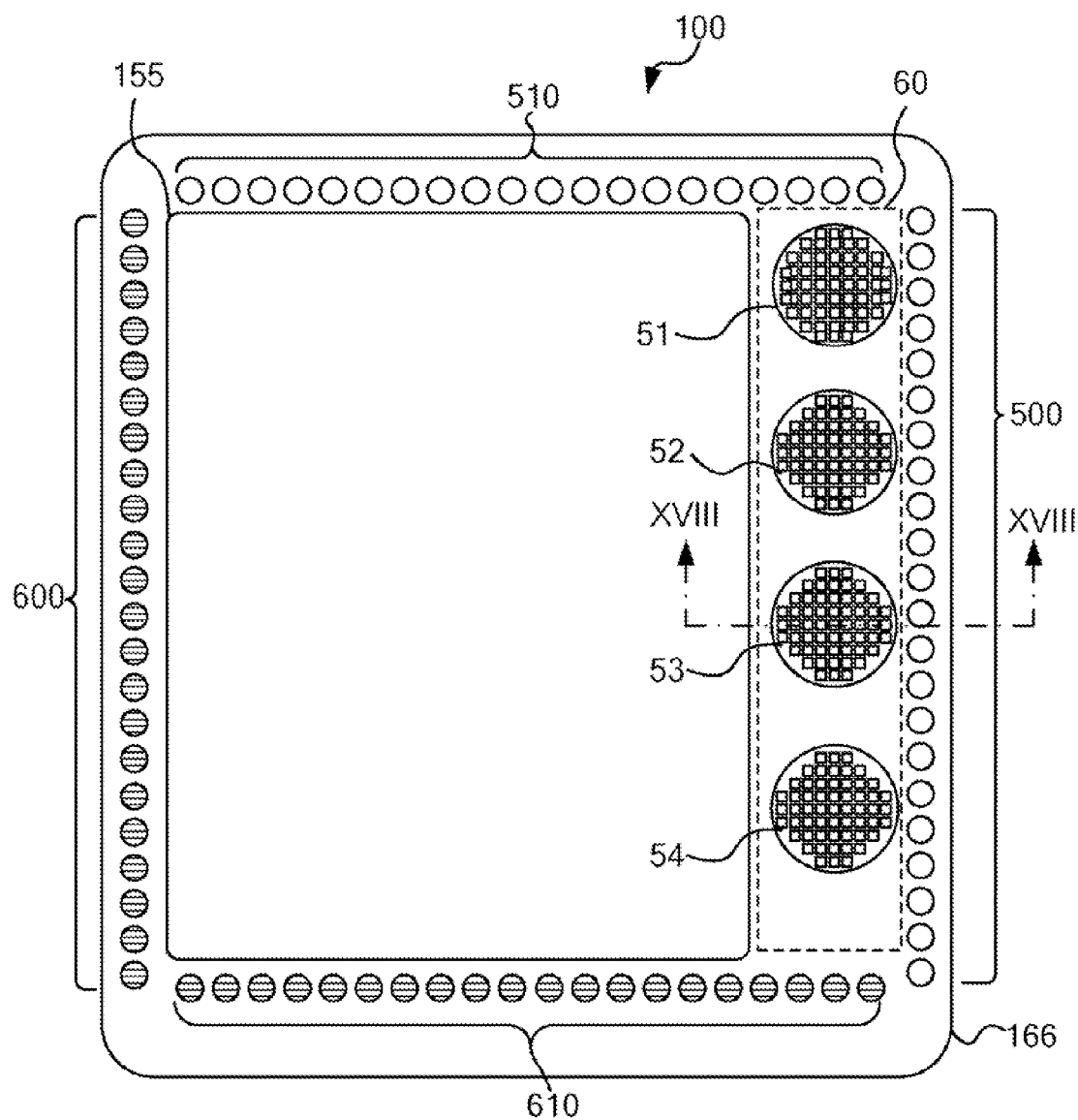
FIG. 17 is a schematic diagram of an alternative embodiment of the electronic reader device, wherein a physical control module of the electronic reader device has operating points thereof structured as keys.
Figure 18:
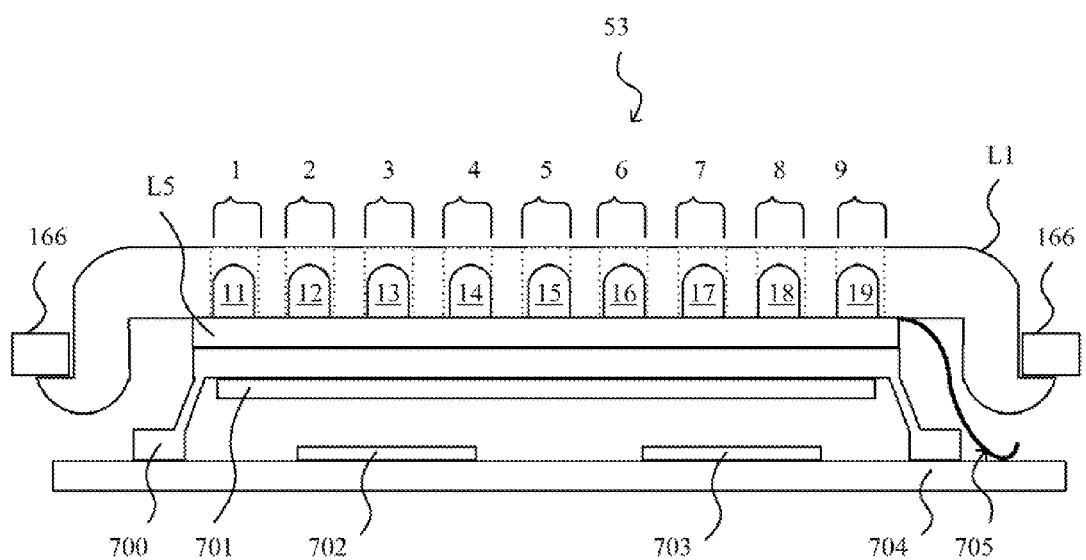
FIG. 18 is an enlarged cross-section of one of the keys of the electronic reader device of FIG. 17, taken along line XVIII-XVIII thereof.

With reference to FIG. 17, the operating points of the control module 60 may be structured as keys in areas 51-54. Each of the operating points is activated by contact. FIG. 18 shows an enlarged cross-section of a key in the area 53, taken along line XVIII-XVIII of FIG. 17. Similar or identical components as between FIG. 18 and FIG. 9A are labeled with the same numbers. A top cover L1 of the key comprises a plurality of transparent windows including windows 1-9, through which lamps including lamps 11-19 may provide illumination. The lamps including lamps 11-19 of the keys are formed on a PCB L5 and connected to the controller 165 through a flexible bus 705. The bus 705 may be comprised in a flexible printed circuit board. A cushion 700 of the key is made of elastic material. A pad 701 is attached to an underside of the cushion 700, and is made of electrically conductive material. Two terminals 702 and 703 of two wires are printed on the PCB 704. The pad 701 may connect the terminals 702 and 703 when the key is depressed. The processor 151 may detect if the key is depressed by determining whether the terminals 702 and 703 are electrically connected to each other.

3.2 Additional Contact Operations

The iconic images shown on the control module 60 may also be referred to as icons. The processor 151 may respond to various contact operations on an operating point based on a status of an icon associated with the operating point.

In response to a drag operation applied to an icon in the "on" state, from an operating point of the control module 60 to the display 155, the processor 151 removes the association between the operating point and a program of the icon and further disables presentation of the icon on the control module 60. Removal of the association between the operating point and the program also cancels an association of the operating point, the icon, and the operations of the program. In response to a contact operation applied to an icon in the "on" state, the processor 151 executes a function represented by the icon. In response to a depress-and-hold operation applied to an icon in the "on" state, the processor 151 brings the program associated with the icon to the foreground of the display 155. The depress-and-hold operation comprises contacting the operating point associated with the icon for a predetermined period of time.

In the suspension mode of the electronic reader device 100, the processor 151 may enter a power saving state while the control module 60 and at least a related IC thereof (such as the controller 165) still remain working in a normal operation state. In response to a contact operation on any icon in the "off" state, the IC related to the control module 60 interrupts the processor 151, and the processor 151 changes the operation mode of the electronic reader device 100 and restores all icons on the control module 60 to the "on" state or the "animated" state.

In response to an event or message notification from a program, the processor 151 changes the status of an icon displayed on an operating point of the control module 60 associated with the program, from an original state to an "animated" state. In response to a contact operation applied to an icon in the "animated" state on the control module 60, the processor 151 prompts a GUI showing a message concerning a program associated with the icon.

In response to a drag operation applied to an icon in the "animated" state, from the control module 60 to the display 155, the processor 151 brings the program associated with the icon to the foreground of the display 155, for further operations.

In response to a drag operation applied to an icon in the "animated" state, from the control module 60 to a border of the control module 60, the processor 151 cancels a message notification from the program associated with the icon and restores the status of the icon to an original state.

4. Conclusion

As described above, the electronic reader device 100 allows transition of icons between the display 155 and the physical control module 60 adjacent to the frame of the display 155. Each operating point of the physical control module 60 may serve as a functional key and is configurable to trigger various functions as required. The physical control module 60 has no printed icons, and thus provides more user-definable features.

It is to be understood, however, that even though numerous characteristics and advantages have been set forth in the foregoing description, together with details of the structures and functions of various embodiments, the disclosure is illustrative only, and changes may be made in detail, especially in the matters of shape, size, and arrangement of parts within the principles of the disclosure to the full extent indicated by the broad general meaning of the terms in which the appended claims are expressed.

Furthermore, although various features and elements are described as embodiments in particular combinations, each feature or element can be used alone or in other various combinations within the principles of the present disclosure to the full extent indicated by the broad general meaning of the terms in which the appended claims are expressed.

What is claimed is:

1. A key structure configured in an electronic product, the electronic product comprising a housing, the key structure comprising:
   a pressing portion located at an outside surface of the housing;
   a printed circuit board (PCB) received in the housing;
   a key electrically connected to the PCB and positioned opposite to the pressing portion, the key comprising a trigger portion and a conductive cover;
   a conductor located between the conductive cover and the pressing portion; and
   a sensor electrically connected with the conductive cover;
   wherein when a first area of the pressing portion corresponding to the trigger portion is pressed, the key structure acts as a mechanical key; and
   when a second area of the pressing portion corresponding to the conductive cover is touched, the sensor receives a signal of a change of capacitance transmitted by the conductive cover, and the key structure acts as a touch key.

2. The key structure of claim 1, wherein the conductor defines a second hole, and the trigger portion is received in the second hole.

3. The key structure of claim 1, wherein the conductor defines a recess opposite to the trigger portion of the key, and the trigger portion is received in the recess.

4. The key structure of claim 1, wherein the conductor comprises a metal spring.

5. The key structure of claim 1, wherein the conductor comprises a conductive sponge.

6. The key structure of claim 1, wherein the key comprises a body, the conductive cover defines a first hole, the trigger portion extends from the body and through the first hole, and the conductive cover covers an outer surface of the body.

7. The key structure of claim 1, wherein the conductive cover comprises a pin electrically connected with the sensor.

8. The key structure of claim 1, wherein the pressing portion comprises a projection extending from an inside surface of the housing toward the trigger portion.

9. An electronic product comprising:

a housing;

a display disposed at a surface of the housing; and a physical control module disposed on the surface of the housing, the physical control module comprising a plurality of key structures, each key structure comprising:

a pressing portion located at the surface of the housing;

a printed circuit board (PCB) received in the housing;

a key electrically connected to the PCB and positioned opposite to the pressing portion, the key comprising a trigger portion and a conductive cover;

a conductor located between the conductive cover and the pressing portion; and a sensor electrically connected with the conductive cover;

wherein when a first area of the pressing portion corresponding to the trigger portion is pressed, the key structure acts as a mechanical key; and when a second area of the pressing portion corresponding to the conductive cover is touched, the sensor receives a signal of a change of capacitance transmitted by the conductive cover, and the key structure acts as a touch key.

10. The electronic product of claim 9, wherein the conductor defines a second hole, and the trigger portion is received in the second hole.

11. The electronic product of claim 9, wherein the conductor defines a recess opposite to the trigger portion of the key, and the trigger portion is received in the recess.

12. The electronic product of claim 9, wherein the conductor comprises a metal spring.

13. The electronic product of claim 9, wherein the conductor comprises a conductive sponge.

14. The electronic product of claim 9, wherein the key comprises a body, the conductive cover defines a first hole, and the trigger portion extends from the body and extends through the first hole, and the conductive cover covers an outer surface of the body.

15. The electronic product of claim 9, wherein the conductive cover comprises a pin electrically connected with the sensor.

16. The electronic product of claim 9, wherein the pressing portion comprises a projection extending from an inside surface of the housing and toward the trigger portion.

* * * * *